(12) United States Patent
Liu et al.

(10) Patent No.: US 12,419,064 B2
(45) Date of Patent: *Sep. 16, 2025

(54) TRENCH CAPACITOR

(71) Applicant: TAIWAN SEMICONDUCTOR MANUFACTURING COMPANY, LTD., Hsinchu (TW)

(72) Inventors: Tao-Cheng Liu, Hsinchu (TW); Shih-Chi Kuo, Hsinchu (TW); Tsai-Hao Hung, Hsinchu (TW); Tsung-Hsien Lee, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/500,291

(22) Filed: Nov. 2, 2023

(65) Prior Publication Data

US 2024/0063251 A1 Feb. 22, 2024

Related U.S. Application Data

(63) Continuation of application No. 17/116,823, filed on Dec. 9, 2020, now Pat. No. 11,810,945, which is a
(Continued)

(51) Int. Cl.
*H10D 1/68* (2025.01)
*H01L 21/768* (2006.01)
(Continued)

(52) U.S. Cl.
CPC .......... *H10D 1/68* (2025.01); *H01L 21/76879* (2013.01); *H10D 1/665* (2025.01); *H10D 1/716* (2025.01); *H10D 84/212* (2025.01)

(58) Field of Classification Search
CPC ... H01L 28/40; H01L 28/90; H01L 21/76879; H01L 27/0805; H01L 29/945; H10D 1/68; H10D 1/665; H10D 1/716; H10D 84/212

See application file for complete search history.

(56) References Cited

U.S. PATENT DOCUMENTS 6,261,895 B1   7/2001   Adkisson et al.
6,440,819 B1   8/2002   Luning
(Continued)

FOREIGN PATENT DOCUMENTS

CN    105493238    4/2016
JP    2008177576   7/2008
KR    20010057853  7/2001

OTHER PUBLICATIONS

Office Action dated Oct. 7, 2020 from corresponding application No. TW 10-920948490; pp. 1-5.
(Continued)

*Primary Examiner* — Dale E Page
*Assistant Examiner* — Quovaunda Jefferson
(74) *Attorney, Agent, or Firm* — Hauptman Ham, LLP

(57) ABSTRACT

A semiconductor device includes a substrate, a first multilayer capacitor, and a second multilayer capacitor. The first multilayer capacitor includes a first plurality of conductive layers. The semiconductor device further includes a first set of contacts including a first contact electrically connected to a first conductive layer, and a second contact electrically connected to a second conductive layer, wherein the first contact is spaced from the second contact by a first distance. The second multilayer capacitor includes a second plurality of conductive layers. The semiconductor device further includes a second set of contacts including a third contact electrically connected to a third conductive layer, and a fourth contact electrically connected to a fourth conductive
(Continued)

layer, wherein the third contact is spaced from the fourth contact by a second distance, and the second distance is different from the first distance.

20 Claims, 10 Drawing Sheets

Related U.S. Application Data continuation of application No. 15/627,614, filed on Jun. 20, 2017, now Pat. No. 10,868,107.

(51) Int. Cl.
  *H10D 1/66* (2025.01)
  *H10D 84/00* (2025.01)

(56) References Cited

U.S. PATENT DOCUMENTS

| | | | |
|---|---|---|---|
| 7,312,131 B2 | 12/2007 | Wu | |
| 8,791,024 B1 * | 7/2014 | Lu | H01L 21/0274 |
| | | | 257/E21.492 |
| 8,853,048 B2 | 10/2014 | Weng et al. | |
| 9,012,296 B2 | 4/2015 | Weng et al. | |
| 9,159,723 B2 | 10/2015 | Chou | |
| 9,209,190 B2 | 12/2015 | Chen et al. | |
| 9,472,690 B2 | 10/2016 | Weng et al. | |
| 10,868,107 B2 | 12/2020 | Liu | |
| 11,810,945 B2 * | 11/2023 | Liu | H01L 29/945 |
| 2003/0134468 A1 | 7/2003 | Wang et al. | |
| 2003/0164514 A1 | 9/2003 | Stamper | |
| 2006/0115952 A1 | 6/2006 | Wu | |
| 2008/0160713 A1 | 7/2008 | Cheng et al. | |
| 2011/0115047 A1 | 5/2011 | Hebert et al. | |
| 2012/0061798 A1 | 3/2012 | Wong et al. | |
| 2012/0104548 A1 | 5/2012 | Hopper et al. | |
| 2014/0374880 A1 | 12/2014 | Chen et al. | |
| 2015/0028450 A1 | 1/2015 | Park et al. | |
| 2016/0204110 A1 | 7/2016 | Baskaran et al. | |

OTHER PUBLICATIONS

Office Action dated Jan. 13, 2022 from corresponding case No. C 201711070901.8 (pp. 1-8).

* cited by examiner

TRENCH CAPACITOR

RELATED APPLICATIONS

This application is a continuation of U.S. patent application Ser. No. 17/116,823, filed Dec. 9, 2020, now U.S. Pat. No. 11,810,945, issued Nov. 7, 2023, which is a continuation of U.S. patent application Ser. No. 15/627,614, filed Jun. 20, 2017, now U.S. Pat. No. 10,868,107, issued Dec. 15, 2020, the entire contents of which are hereby incorporated by reference.

BACKGROUND

Semiconductor devices that utilize on-chip capacitors include dynamic random access memories (DRAMs), voltage controlled oscillators (VCOs), phase-locked loops (PLL), operational amplifiers (OP-AMPS), and switching (or switched) capacitors (SCs). Such on-chip capacitors are also usable to decouple digital and analog integrated circuits (ICs) from electrical noise generated in or transmitted by other components of a semiconductor device.

Capacitor structures for ICs have evolved from the initial parallel plate capacitor structures, having two conductive layers separated by a dielectric, to more complex capacitor designs for meeting specifications for high capacitance in increasingly smaller devices. These more complex designs include, for example, metal-oxide-metal (MOM) capacitor designs and interdigitated finger MOM capacitor structures. Capacitors utilized in DRAM devices, for example, include stacked capacitors above a substrate or trench capacitors where conductive material extends across a surface of the substrate and/or into multiple trenches.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1:
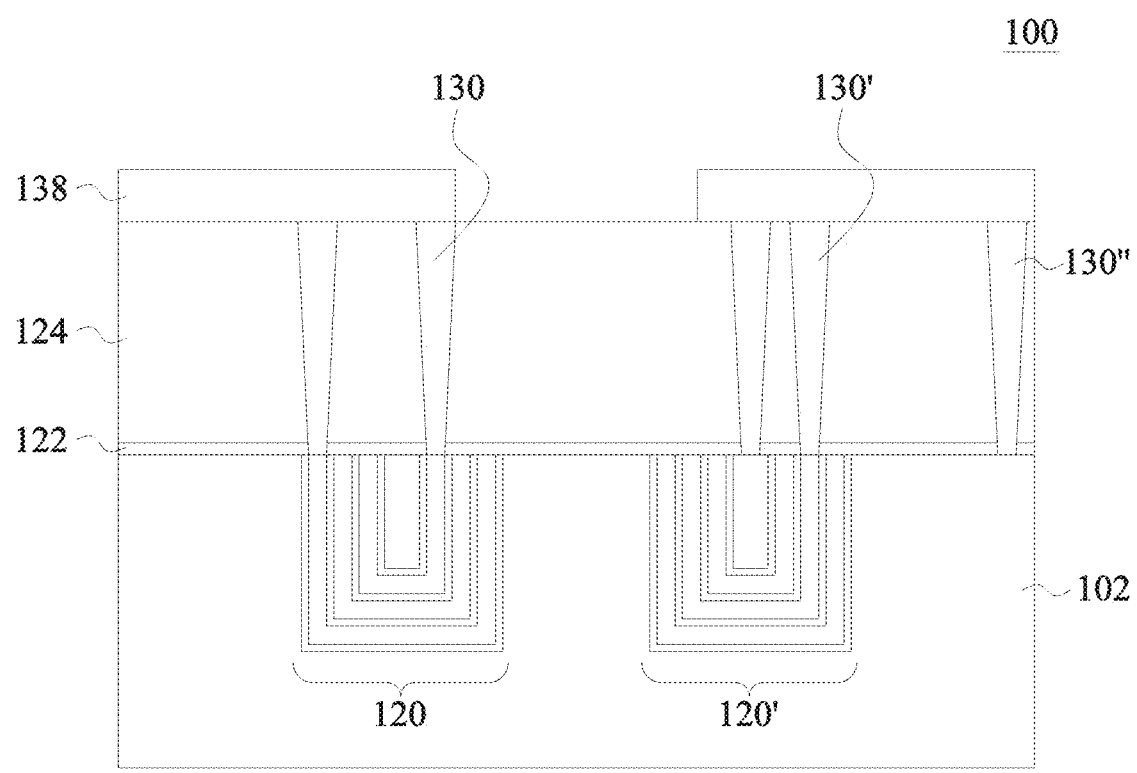
FIG. 1 is a cross-sectional view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The design rules utilized in the layout and manufacture of semiconductor devices such as DRAMs continue to reduce device dimensions in order to meet advanced device density and performance targets. Successfully fabricating devices with such small dimensions and tolerances involves precise control in the associated manufacturing operations. For example, methods of forming multilayer trench capacitors include multiple steps of depositing alternating conductive and dielectric layers in a trench followed by repeated cycles of patterning, etching, or pattern removal to produce the designed capacitor or capacitor array. Deeper trenches facilitate increased capacitance density without increasing a surface area of a semiconductor substrate dedicated to the capacitor structure.

FIG. 1 is a cross-sectional view of a semiconductor device 100 in accordance with some embodiments. Semiconductor device 100 includes a substrate 102. A first trench capacitor structure 120 is in substrate 102. A second trench capacitor structure 120' is in substrate 102. Trench capacitor structures 120, 120' each include alternating pairs of dielectric layers and conductive layers. A contact etch stop layer (CESL) 122 is over a substantially planar top surface of substrate 102. CESL 122 extends over trench capacitor structures 120, 120'. An interlayer dielectric (ILD) layer 124 is over CESL 122. Contact plugs 130, 130' extend through ILD layer 124 and CESL 122 and electrically connect to individual conductive layers in trench capacitor structures 120, 120'. In some embodiments, one of contact plugs 130" is electrically connected to substrate 102 to provide a ground contact for semiconductor device 200. Conductive lines 138 electrically connect contact plugs 130 which are connected to trench capacitor structure 120 or 120'. In some embodiments, conductive lines 138 are electrically connected together by an interconnect structure.

In some embodiments, first trench capacitor structure 120 is identical to second trench capacitor structure 120'. In some embodiments, a depth of first trench capacitor structure 120 in substrate 102 is different from a depth of second trench capacitor structure 120' in substrate 102. In some embodiments, a width of first trench capacitor structure 120 in substrate 102 is different from a width of second trench capacitor structure 120' in substrate 102. In some embodiments, a number of pairs of dielectric layers and conductive layers of first trench capacitor structure 120 in substrate 102 is different from a number of pairs of dielectric layers and conductive layers of second trench capacitor structure 120' in substrate 102.

A size and number of pairs of dielectric layers and conductive layers in trench capacitor structures 120, 120' determine a capacitance of semiconductor device 100. In addition, a contact location of contact plugs 130 to different conductive layers of trench capacitor structures 120, 120' also helps to determine a capacitance of semiconductor device 100. As a number of dielectric layers between the conductive layers electrically connected to contact plugs 130 increases, a capacitance of semiconductor device 100 increases. For example, contact plugs 130 are electrically connected to adjacent conductive layers in first trench capacitor structure 120, so there is one dielectric layer between the conductive layers electrically connected to contact plugs 130. In contrast, contact plugs 130 are electrically connected to a center conductive layer and a second conductive layer in second trench capacitor structure 120', so that two dielectric layers are between the conductive layers electrically connected to contact plugs 130. As a result, a capacitance of second trench capacitor structure 120' is greater than a capacitance of first trench capacitor structure 120. By determining a size, i.e., depth and width, of trench capacitor structures 120, 120', a location of contact plugs 130 electrically connected to trench capacitor structures 120, 120', and electrical connections between trench capacitor structures 120, 120', a capacitance of semiconductor device 100 is selectable in order to satisfy design criteria for integrated circuits (ICs), such as DRAMS.

FIGS. 2A-2M are cross-sectional views of a trench capacitor at various stages of manufacture in accordance with some embodiments. Like items are indicated by like reference numerals, and for brevity, descriptions of the structure, provided with reference to previous figures will generally not be repeated in connection with subsequent figures.

Figure 2A:
FIGS. 2A-2M are cross-sectional views of a semiconductor device at various stages of production in accordance with some embodiments.

FIG. 2A is a cross-sectional view of a semiconductor device 200 following deposition of a mask layer in accordance with some embodiments. Semiconductor device 200 includes a substrate 102 including one or more semiconductor materials. A mask layer 104 is over a top surface of substrate 102. Examples of suitable materials for substrate 102 include, but are not limited to, elementary semiconductor materials, compound semiconductor materials, and/or alloy semiconductor materials.

Examples of elementary semiconductor materials include, but are not limited to, monocrystalline silicon (Si), polycrystalline silicon (poly-Si), amorphous silicon (a-Si), germanium (Ge), and/or diamond (C). Examples of binary compound semiconductor materials include, but are not limited to, IV-IV materials including silicon germanium (SiGe), germanium carbide (GeC), and silicon carbide (SiC), and III-V materials including gallium arsenide (GaAs), gallium phosphide (GaP), indium phosphide (InP), indium arsenide (InAs), and/or indium antimonide (InSb). Examples of tertiary and quaternary compound semiconductor materials include, but are not limited to, GaAsP, AlInAs, AlGaAs, GaInAs, GaInP, and/or GaInAsP.

In some embodiments, the semiconductor layer(s) incorporated in the substrate 102 are formed using a suitable technique or method including, but not limited to, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), atomic layer deposition (ALD), and/or combinations thereof.

In some embodiments, the substrate 102 includes both a semiconductor material and an insulating material to form a semiconductor-on-insulator (SOI) substrate. In some embodiments, SOI substrates include one or more semiconductor layers formed on an insulating material such as silicon dioxide or sapphire (silicon-on-sapphire (SOS)). In some embodiments, the substrate 102 includes one or more epitaxial layers (epi-layer) and/or a strained layer resulting from an atomic and/or lattice mismatch.

In some embodiments, one or more dopant(s) are introduced into the substrate during formation of the substrate, in the case of a single-layer substrate, or during formation of one or more layers comprising a multi-layer substrate. In some embodiments, one or more of the semiconductor materials included in a multi-layer substrate are undoped. In some embodiments, one or more of the semiconductor materials are doped with at least one p-type and/or n-type dopant depending on the functional and/or performance target parameters for the semiconductor devices being manufactured on the substrate.

In addition to a primary or bulk doping profile, in some embodiments one or more of the semiconductor materials of substrate 102 further include doped regions in which at least one dopant is introduced into the substrate 102 to provide a primary dopant profile, to reverse the primary doping profile, or to enhance the primary doping profile to provide isolation regions, wells, contacts, or other electrically active structures within the substrate. For example, in some embodiments, the doped regions include p-type dopants, such as boron (as B or $BF_2$), aluminum (Al), gallium (Ga), beryllium (Be), zinc (Zn), cadmium (Cd), silicon (Si), and germanium (Ge); n-type dopants, such as phosphorus (P), antimony (Sb), arsenic (As), selenium (Se), tellurium (Te), silicon (Si), and germanium (Ge); and/or combinations thereof.

In some embodiments, mask layer 104 is a soft mask, a hard mask or a hybrid soft/hard mask selected depending on parameters such as the etch conditions and chemistry or chemistries being utilized, the substrate material(s) being etched, and the depth of the trenches being formed. Examples of suitable materials for mask layer 104 include, but are not limited to, photoresist, polyimide, silicon oxide, silicon nitride (e.g., $Si_3N_4$), SiON, SiC, SiOC, or combinations thereof. In some embodiments, mask layer 104 includes at least two materials, e.g., a layer of silicon oxide and a layer of silicon nitride, while in other embodiments, mask layer 104 includes one or more layers of a single material, e.g., silicon oxide.

Figure 2B:
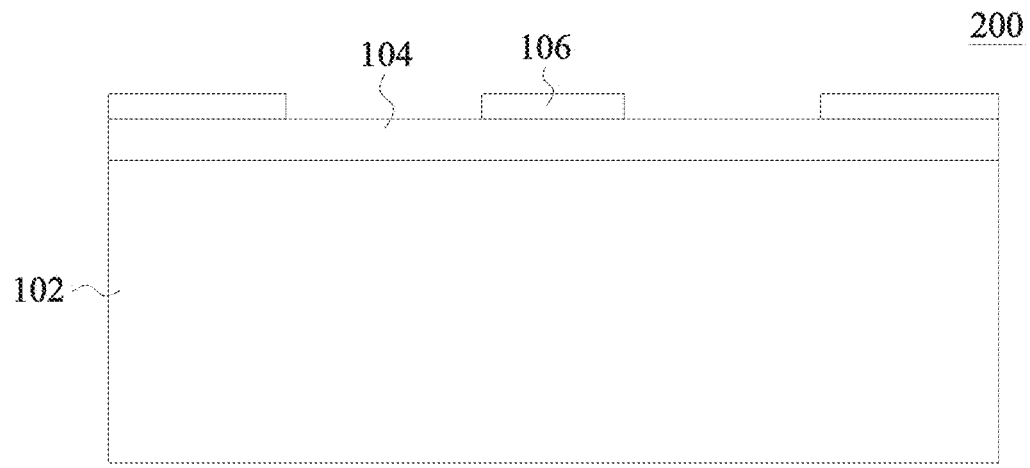

FIG. 2B is a cross-sectional view of semiconductor device 200 following formation of a patterned photoresist in accordance with some embodiments. A photoresist layer is formed on the mask layer 104. The photoresist layer is patterned using a photomask or another imaging process, and then developed to form a trench photoresist pattern 106 exposing portions of the mask layer 104.

Figure 2C:
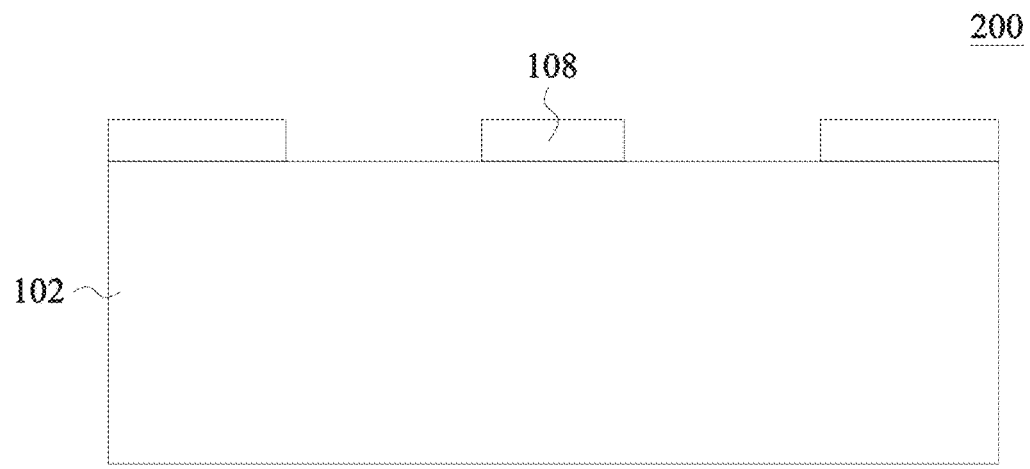

FIG. 2C is a cross-sectional view of semiconductor device 200 following etching of the mask layer 104 in accordance with some embodiments. The exposed portions of the mask layer 104 are removed to form a trench etch mask 108 that exposes portions of the substrate 102 in which the trench capacitor(s) will be formed. Depending on the material(s) used, mask layer 104 is etched using a dry etching method with a plasma generated from a halogen-containing etchant selected, for example, from a group including $CF_4$, $SF_6$, $NF_3$, $Cl_2$, $CCl_2F_2$, $SiCl_4$, $BCl_2$, or a combination thereof. In some embodiments, a wet etching method using, for example, at least one aqueous etch solution including citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), tetramethylammonium hydroxide (TMAH), or a combination thereof, is utilized for removing the exposed portions of the substrate 102. In some embodiments, mask layer 104 is etched using an etching sequence including both wet and dry etching techniques. In some embodiments, the trench photoresist pattern 106 is removed before etching the substrate 102. In some embodiments, at least a portion of trench photoresist pattern 106 remains as part of the trench etch mask 108. In some embodiments, after the photoresist layer is removed using a wet, dry, or combination photoresist removal process, the surface of the trench etch mask 108 is subjected to additional cleaning to remove residual particles.

Figure 2D:
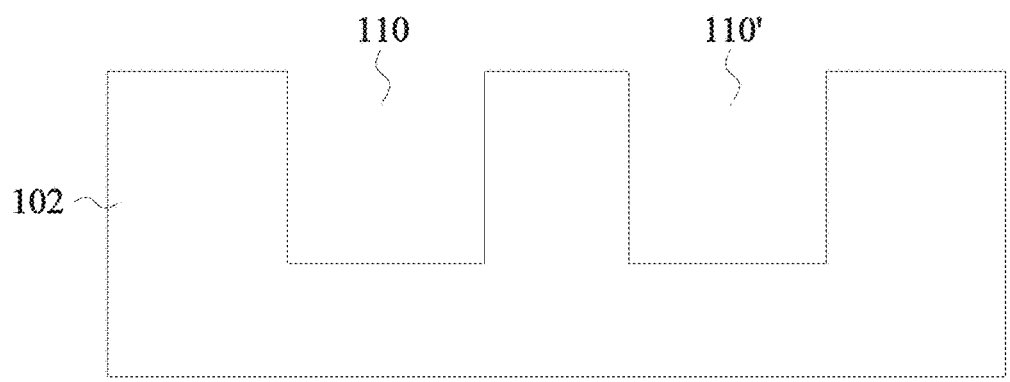

FIG. 2D is a cross-sectional view of semiconductor device 200 following etching of substrate 102 and removal of trench etch mask 108 in accordance with some embodiments. The portions of substrate 102 exposed by trench etch mask 108 are etched to form one or more trenches 110, 110'. In some embodiments, substrate 102 is etched using plasma etching (PE) or reactive ion etching (RIE). In some embodiments, the trench etch mask 108 remains on substrate 102 (not shown) through additional processing steps until removed during a subsequent CMP process. In some embodiments, one or more cleaning steps follow the formation of trenches 110, 110' in substrate 102.

Semiconductor device 200 includes two trenches. In some embodiments, the number of trenches is more than two.

The trench 110 is characterized by a width (W), $W_T$; a length (L), $L_T$; a depth (D), $D_T$; and an aspect ratio (AR), $AR_T = D_T/W_T$. Trench 110' is characterized by a width (W), $W_{T'}$; a length (L), $L_{T'}$; a depth (D), $D_{T'}$; and an aspect ratio (AR), $AR_{T'} = D_{T'}/W_{T'}$. In some embodiments, the aspect ratios of the trenches 110 and 110' are each at least 10. In some embodiments, the aspect ratio of the trenches 110 and 110' are independently at least 25. In some embodiments, adjacent trenches are separated by a residual portion of substrate 102 that was protected by trench etch mask 108. In some embodiments, the trenches 110, 110' will have substantially identical dimensions. In some embodiments, the trenches 110 and 110' have at least one dimension different from each other. Variations in the trench dimensions allow the capacitance of the various trench capacitors to be independently adjusted for the particular design of the active devices that will be electrically connected to the trench capacitors.

In some embodiments that utilize a combination of a wide trench and a narrow trench, the relative sizing of the wide trench and narrow trench is adjusted whereby the wide trench is filled by the formation of a predetermined number (N) of pairs of dielectric layers and conductive layers and the narrow trench will be filled by the formation of a fewer number of pairs (N-x, where x is an integer) of dielectric layers and conductive layers. In some embodiments, the predetermined number of pairs N will be less than 10. In some embodiments, the predetermined number of pairs N will be 10 or greater.

In some embodiments, both a first trench etch mask 108 and a second trench etch mask (not shown) are utilized to expose, in sequence, first and second regions of the substrate 102. The exposed first and second regions are then independently subjected to different etch processes or etch durations to form first and second trenches 110, 110' having different trench dimensions, such as different depths (not shown). The availability of trenches having different depths provides another technique for adjusting the capacitance levels of the trench capacitors for the particular designs of the active devices that will be electrically connected to the various trench capacitors while utilizing the same or similar capacitor structure surface dimensions.

In some embodiments, a dopant species is introduced into the substrate 102 exposed within trenches 110 and 110' to form a doped well region (not shown). In some embodiments, substrate 102 has a first conductivity type and the volume of the dopant species introduced is sufficient to convert the doped well region to a second conductivity type different from the first conductivity type. For example, in some embodiments, an n-well region is formed in a p-type substrate by introducing a sufficient number of phosphorus atoms and/or another suitable n-type dopant species into the semiconductor material exposed within the trenches 110 and 110'. In some embodiments, a p-well region is formed in an n-type substrate by introducing a sufficient number of boron atoms or another suitable p-type dopant species into the semiconductor material exposed within the trenches 110 and 110'.

Figure 2E:
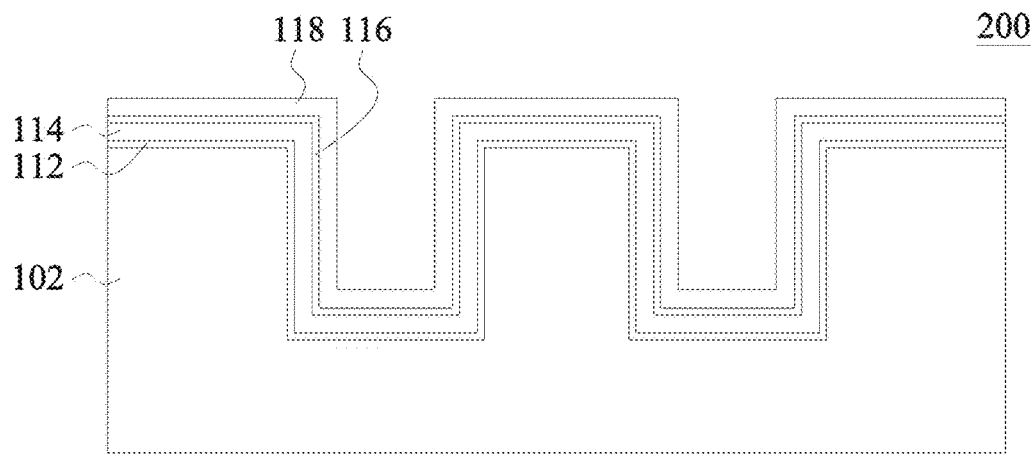

FIG. 2E is a cross-sectional view of semiconductor device 200 following formation of dielectric and conductive layers in accordance with some embodiments. A first dielectric layer 112 is deposited along the exposed surfaces of substrate 102 and the sidewalls and bottom surface of trenches 110 and 110'. In some embodiments where trench mask pattern 108 remains, trench mask pattern 108 is between a top surface of substrate 102 and first dielectric layer 112.

In some embodiments, the first dielectric layer 112 is formed by using chemical vapor deposition (CVD), atomic layer deposition (ALD), high density plasma CVD, sputtering, atomic layer deposition (ALD), or any other suitable method, or combination of methods, for forming a generally conformal dielectric layer on the exposed surfaces of both the substrate 102 and the trenches 110, 110'. In some embodiments, the first dielectric layer 112 includes a single layer. In some embodiments, the first dielectric layer 112 includes a multilayer structure of one or more suitable dielectric materials. Examples of suitable materials for the first dielectric layer 112 include, but are not limited to, silicon oxide (e.g., $SiO_2$), silicon nitride (e.g., $Si_3N_4$), SiON, SiC, SiOC, or a combination thereof.

In some embodiments, the first dielectric layer 112 includes one or more dielectric materials including, but not limited to, hafnium oxide ($HfO_x$), lanthanum monoxide (LaO), aluminum monoxide (AlO), aluminum oxide ($Al_2O_3$), zirconium monoxide (ZrO), titanium monoxide (TiO), tantalum pentoxide ($Ta_2O_5$), strontium titanate ($SrTiO_3$), barium titanate ($BaTiO_3$), hafnium silicate (HfSiO), lanthanum silicate (LaSiO), aluminum silicate (AlSiO), hafnium titanate ($HfTiO_4$) or combinations thereof.

In some embodiments, depositing the first dielectric layer 112 includes depositing an oxide layer, depositing a nitride layer, and depositing a second oxide layer to form an oxide-nitride-oxide (ONO) three-layer structure (not shown). In some embodiments, depositing the first dielectric layer 112 includes depositing an oxide layer and depositing a nitride layer to form a two-layer oxide-nitride (ON) structure (not shown). In some embodiments, the oxide layer is a silicon oxide ($SiO_x$) and the nitride layer is a silicon nitride ($Si_xN_y$).

In some embodiments, other dielectric materials are sequentially deposited on the substrate to form different and/or more complex multilayer dielectric structures. In some embodiments, the dielectric layer(s) of the first dielectric layer 112 have a substantially uniform composition throughout the thickness of the first dielectric layer 112. In some embodiments, a composition of one or more of the dielectric layers of the first dielectric layer 112 varies across the thickness of the first dielectric layer 112.

In some embodiments, the first dielectric layer 112, as deposited, has a first or lower portion along the sidewall surfaces and the bottom surfaces of each trench 110, 110' and a second or upper portion extending over the top surface of the trench etch mask 108 (not shown).

A first conductive layer 114 is formed over the first dielectric layer 112. Examples of suitable materials for the first conductive layer 114 include, but are not limited to, polysilicon, metals, metal nitrides, silicides, metal alloys, or other suitable electrically conductive materials or combinations thereof. In some embodiments, the first conductive layer 114 has a single layer structure. In some embodiments, the first conductive layer has a multiple-layer structure including two or more materials that may provide conductive and/or additional functionality including, for example, a barrier layer, a capping layer, a seed layer, and/or other suitable layers (not shown) that are selected to provide a predetermined combination of desired conductive properties.

In some embodiments, the first conductive layer 114, as deposited, has a first or lower portion over the first dielectric layer 112 along the sidewall surfaces and the bottom surfaces of each trench 110, 110' and a second or upper portion extending over the first dielectric layer 112 that is over the top surface of trench etch mask 108 (not shown).

A second dielectric layer 116 is deposited over the first conductive layer 114. In some embodiments, the second dielectric layer 116 includes the dielectric materials and structures described in connection with the first dielectric layer 112 and/or was deposited using the same process(es) utilized in connection with the first dielectric layer. In some embodiments, one or more of the dielectric layers comprising the second dielectric layer 116 exhibits a different structure than that of the first dielectric layer 112 in terms of the dielectric material(s) utilized, the thicknesses of the material layer(s) comprising the second dielectric layer and/or the process(es) used to deposit the second dielectric layer.

In some embodiments, the second dielectric layer 116, as deposited, has a first portion disposed over the first conductive layer 114 along the sidewall surfaces and the bottom surfaces of each trench 110, 110' and a second portion extending over the upper surface of the first conductive layer 114 over the top surface of the trench etch mask 108 (not shown).

A second conductive layer 118 is formed over the second dielectric layer 116. In some embodiments, at least one of the first conductive layer 114 or the second conductive layer 118 includes titanium nitride. In some embodiments, both the first conductive layer 114 and the second conductive layer 118 include the same conductive material(s) and/or are deposited to substantially the same thickness. In some embodiments, one or more of the conductive layers of the second conductive layer 118 exhibits a different structure than that of the first conductive layer 114 in terms of the conductive material(s) utilized, the thicknesses of the material layer(s) of the second conductive layer and/or the process(es) used to deposit the second conductive layer.

Figure 2F:
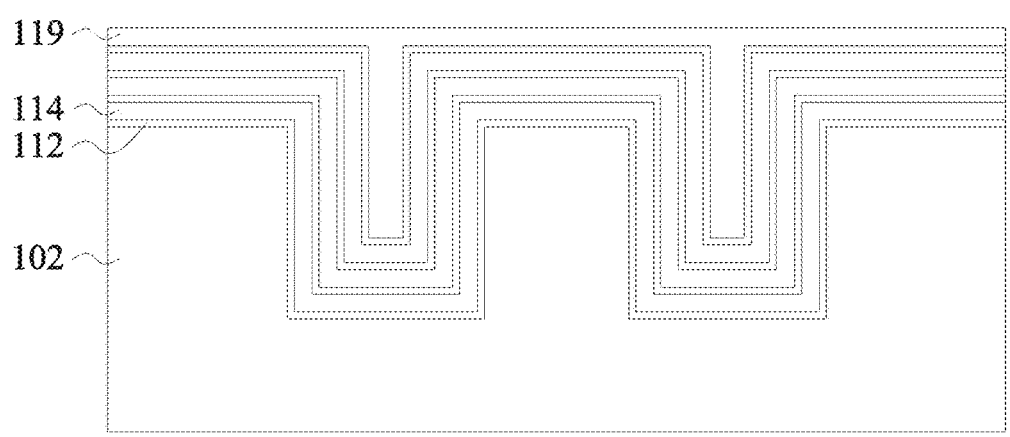

FIG. 2F is a cross-sectional view of semiconductor device 200 following filling of trenches 110 and 110' in accordance with some embodiments. Additional pairs of dielectric layers and conductive layers are sequentially applied to the substrate 102 until a final or top conductive layer 119 is deposited and the trenches 110, 110' are filled. In some embodiments, each trench 110, 110' provides the basic structure for a trench capacitor structure containing a predetermined number (N) of dielectric layers and conductive layers. The number of layers, the thickness(es) of the layers, and material(s) comprising the layers selected for filling the trenches 110, 110', in combination with the dimensions of the trenches, are factors that will determine the level of capacitance provided by the completed trench capacitors. In some embodiments, the predetermined number (N) of dielectric layer and conductive layer pairs utilized to obtain the desired capacitive performance is less than 10. In some embodiments, the predetermined number (N) is between 10 and 20. In some embodiments, the predetermined number (N) is greater than 20.

In some embodiments, a minimum thickness of the conductive layers incorporated into the trench capacitors is selected so as to be within the process control parameters achievable in the subsequent patterning and etching methods. In some embodiments, the thickness of each of the N conductive layers, e.g., 114, 118, 119, is sufficient to allow suitable contact and/or via openings to be patterned and opened to expose contact regions on corresponding N upper surfaces, e.g., 114', 118', 119', of the conductive layers to which electrical contact is established during subsequent processing.

Accordingly, as the performance of the patterning and etching processes improves, progressively thinner conductive layers are successfully incorporated into the trench capacitors manufactured according to embodiments of the methods disclosed herein. Depending on the material(s) used and the configuration of the conductive layers, in some embodiments, each of the conductive layers has a thickness of about 200 Å to about 600 Å. In some embodiments, certain of the conductive layers have a different thickness from at least one of the conductive layers meeting or exceeding a predetermined minimum design thickness. In some embodiments, each of the conductive layers has a thickness of about 400 Å to about 450 Å.

In some embodiments, different dielectric material(s) and/or different dielectric layer thicknesses are included in the multilayer trench capacitor structures. In some embodiments, the dielectric materials selected have a dielectric constant of at least 7. In some embodiments, the dielectric materials selected have a dielectric constant of at least 10. In some embodiments, a ratio of the thickness of a dielectric layer and the thickness of an adjacent conductive layer is between about 5 and about 9. In some embodiments, a ratio of the thickness of a dielectric layer and the thickness of an adjacent conductive layer is between about 6 and about 8. In some embodiments, certain of the dielectric layers have a different thickness and/or include a different dielectric material than other dielectric layers in the multilayer trench capacitor structures. In some embodiments, each of the dielectric layers includes one or more high-k materials, i.e., materials having a dielectric constant greater silicon oxide.

In some embodiments, each of the dielectric layers has a thickness of about 70 Å to about 80 Å.

Figure 2G:
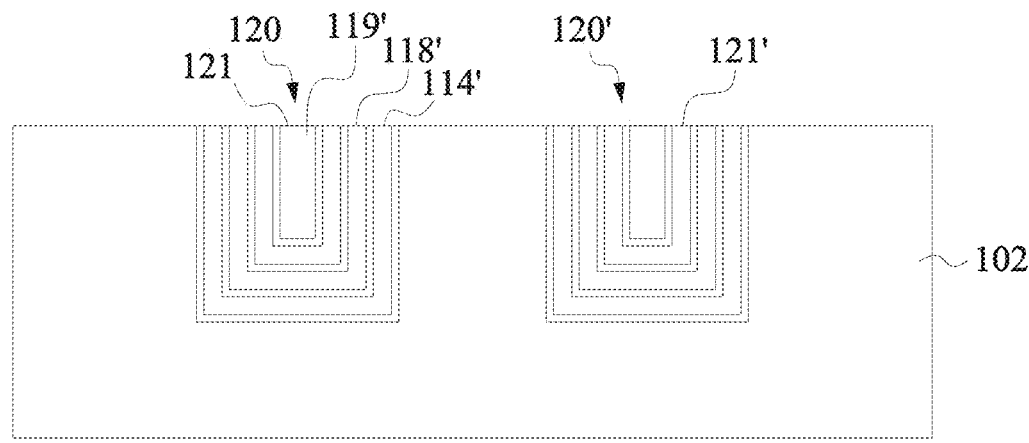

FIG. 2G is a cross-sectional view of semiconductor device 200 following a planarization process in accordance with some embodiments to produce a planarized top surface. The planarization process is used to remove portions of the dielectric layers and conductive layers over substrate 102 and expose a top surface of the substrate. The planarization process defines multilayer trench capacitor structures 120 in trench 110 and multilayer trench capacitor 120' in the trench 110'. In some embodiments, the planarization process includes a chemical mechanical polishing (CMP) process to remove portions of each of the previously deposited conductive layers and dielectric layers. The CMP process removes the upper portions of the dielectric layers and conductive layers that extend above and/or over the surface of substrate 102. In some embodiments, a different planarization process, such as etching or grinding, is used to remove the dielectric and conductive layers above substrate 102.

The resulting structure also provides a planarized top surface for subsequent processing and exposes upper surface regions 114', 118', 119' for each of the N conductive layers having a width corresponding to the thickness of each of the deposited conductive layers 114, 118, 119. In some embodiments, the width of the upper surface region 119' of the final or top conductive layer 119, is larger than the upper surface regions of each of the underlying conductive layers.

Figure 2H:
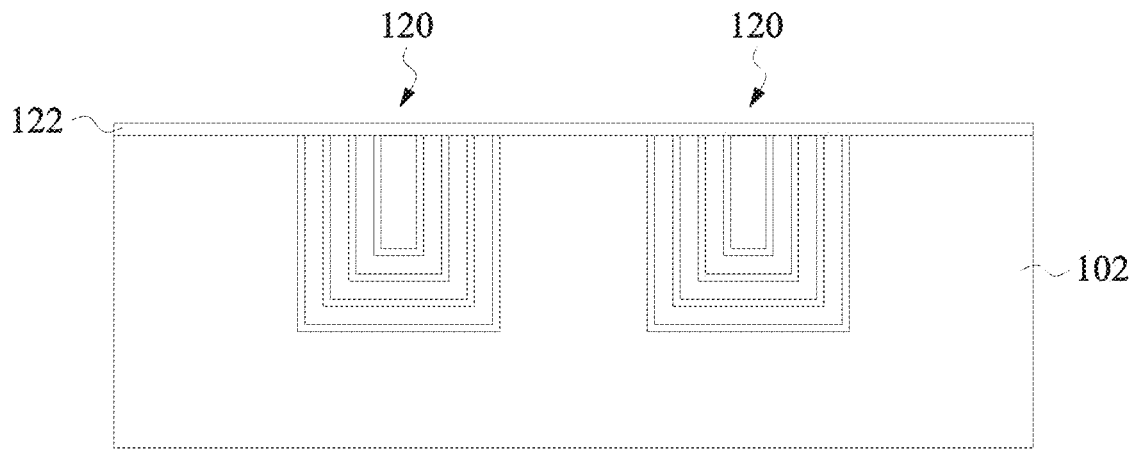

FIG. 2H is a cross-sectional view of semiconductor device 200 following deposition of a contact etch stop layer (CESL) 122 in accordance with some embodiments. CESL 122 is formed on the top surface of substrate 102. In some embodiments, CESL 122 is omitted. CESL 122 includes one or more suitable materials including, but not limited to, $SiN_x$, $SiO_x$, SiON, SiC, SiCN, BN, SiBN, SiCBN, or combinations thereof. In some embodiments, the CESL 122 is formed by chemical vapor deposition (CVD), plasma-enhanced chemical vapor deposition (PE-CVD), physical vapor deposition (PVD), atomic layer deposition (ALD), spin-on coating, other suitable formation process(es), or combinations thereof.

Figure 2I:
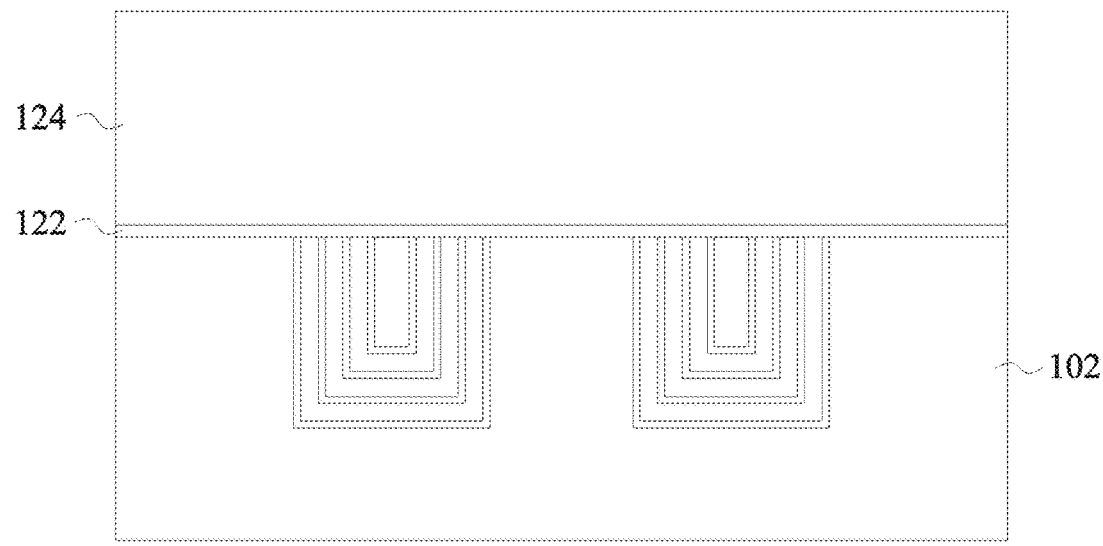

FIG. 2I is a cross-sectional view of semiconductor device 200 following deposition of an interlayer dielectric (ILD) layer 124. IDL layer 124 is deposited on the CESL 122. In some embodiments where CESL 122 is omitted, the ILD layer 124 is deposited directly on the substrate 102 and upper surface portions 121, 121' of the trench capacitor structures 120, 120'.

In some embodiments, the ILD layer 124 includes one or more materials including, but not limited to, $SiN_x$, $SiO_x$, SiON, SiC, SiCN, BN, SiBN, SiCBN, borophosphosilicate glass (BPSG), tetraethyl orthosilicate (TEOS), spin on glass (SOG), undoped silicate glass (USG), fluorinated silicate glass (FSG), high-density plasma (HDP) oxide, plasma-enhanced TEOS (PETEOS) or combinations thereof. The ILD layer 124 has a different etch selectivity from CESL 122.

In some embodiments, the ILD layer 124 is formed by chemical vapor deposition (CVD), plasma-enhanced chemical vapor deposition (PE-CVD), physical vapor deposition (PVD), atomic layer deposition (ALD), spin-on coating, other suitable formation process(es), or combinations thereof. In some embodiments, the ILD layer 124 is formed using a same process as that used to form CESL 122. In some embodiments, the ILD layer 124 is formed using a different process from that used to form CESL 122.

Figure 2J:
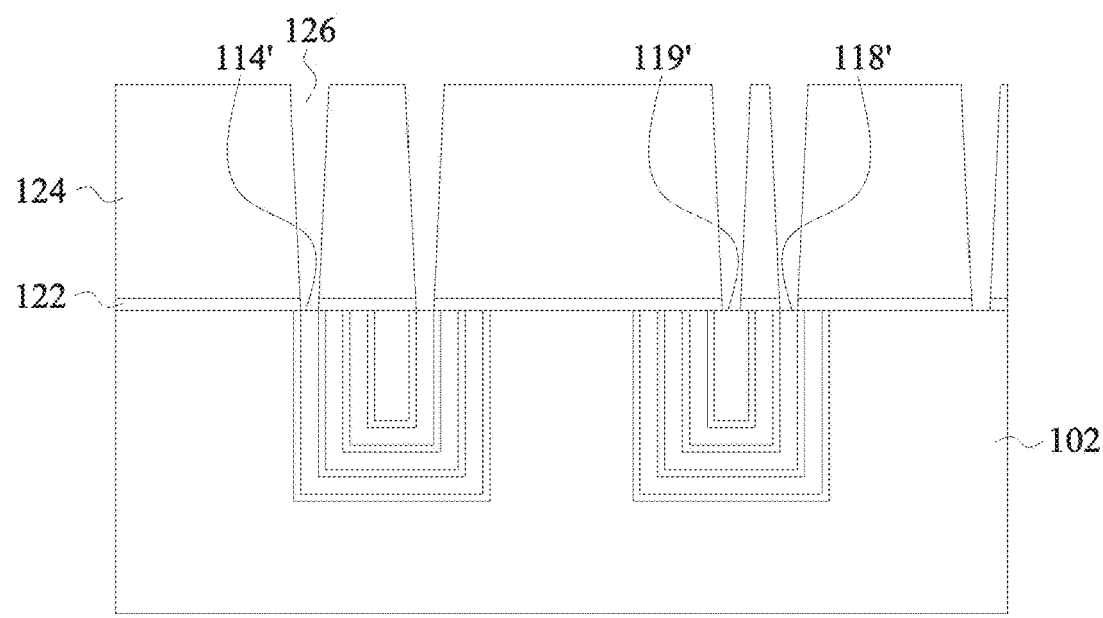

FIG. 2J is a cross-sectional view of semiconductor device 200 following formation of contact openings in accordance with some embodiments. In some embodiments, a contact etch pattern (not shown) is formed on the surface of the ILD layer 124. The contact etch pattern exposes predetermined regions of the ILD layer 124 overlying the conductive layers 114, 118, 119. In some embodiments, a plasma etch process, a combination wet/dry etch processes, other suitable etch process(es), or a combination thereof, is then used to form contact openings 126. The contact openings 126 extend through the ILD layer 124 and the CESL 122 (when present) and expose contact regions on the upper surface regions 114', 118', 119' of the conductive layers 114, 118, 119. In some embodiments including both a CESL and an ILD layer, the materials, layer thicknesses, and/or the etch chemistry or chemistries are selected to provide different etch rates for the CESL and ILD layer. The different etch rates allow the ILD layer material to be cleared from the contact openings using a predetermined or controlled degree of overetch while reducing the likelihood of damage to the surface of the conductive materials underlying the CESL.

Figure 2K:
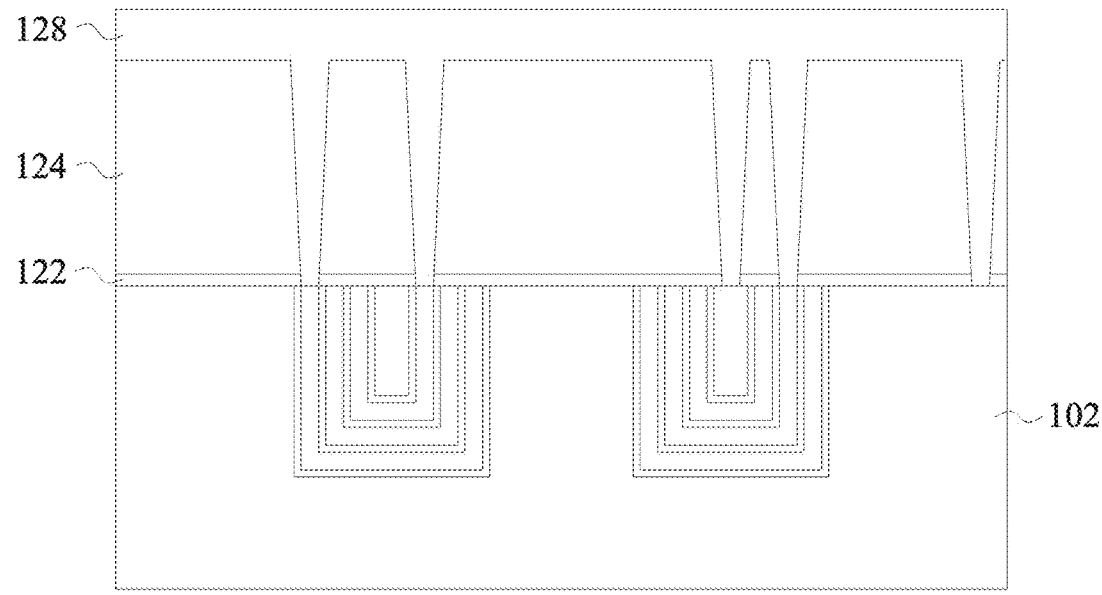

FIG. 2K is a cross-sectional view of semiconductor device 200 following deposition of conductive contact material layer 128 in accordance with some embodiments. The conductive contact material layer 128 is applied to fill contact openings 126 and to contact conductive layers 114', 118', 119'. In some embodiments, the conductive contact material layer 128 comprises only a single material while in other embodiments a multi-layer structure is utilized. In some embodiments, the conductive contact material layer 128 includes a barrier layer (not shown) for suppressing diffusion between the materials separated by the barrier layer, e.g., the conductive layers 114, 118, 119 of the trench capacitor structures 120, 120' and one or more of the conductive materials comprising a portion of the conductive contact material layer 128. In some embodiments, the conductive contact material layer 128 includes copper, aluminum, tungsten, or another suitable conductive material. In some embodiments, the conductive contact material layer 128 is formed using plating, PVD, sputtering, or another suitable formation process.

Figure 2L:
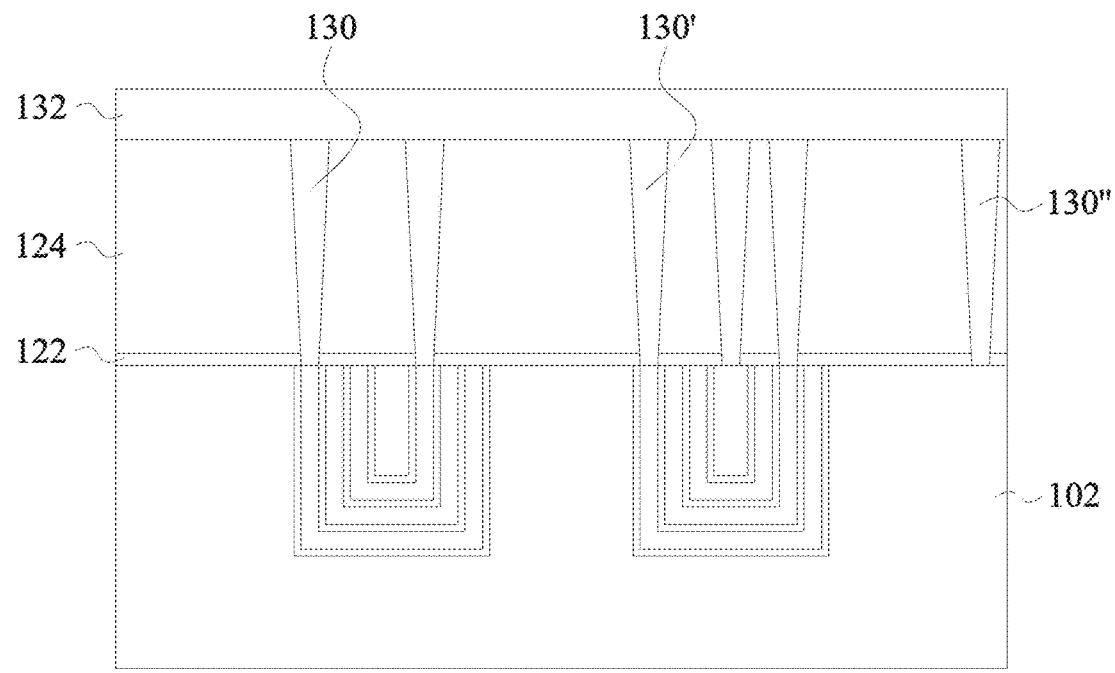

FIG. 2L is a cross-sectional view of semiconductor device 200 following formation of interconnect material layer 132 in accordance with some embodiments. The conductive contact material layer 128 is planarized using CMP, grinding, etching or another suitable method to remove an upper portion of the contact material layer and expose an upper surface of the ILD layer 124 while leaving a residual portion of the contact material layer in the contact openings 126 to form contact plugs 130. Interconnect material layer 132 is deposited over the planarized surface of the ILD layer 124 and the exposed upper surfaces of contact plugs 130. In some embodiments, interconnect material layer 132 is part of an interconnect structure. In some embodiments, the interconnect material layer 132 includes copper, aluminum, tungsten, or another suitable conductive material. In some embodiments, the interconnect material layer 132 is forming using plating, PVD, sputtering, or another suitable formation process. In some embodiments, interconnect material layer 132 is a same material as contact plugs 130. In some embodiments, interconnect material layer 132 is a different material from contact plugs 130. In some embodiments, interconnect material layer 132 is formed using a same process as that used to form conductive contact material layer 128. In some embodiments, interconnect material layer 132 is formed using a different process from that used to form conductive contact material layer 128.

Figure 2M:
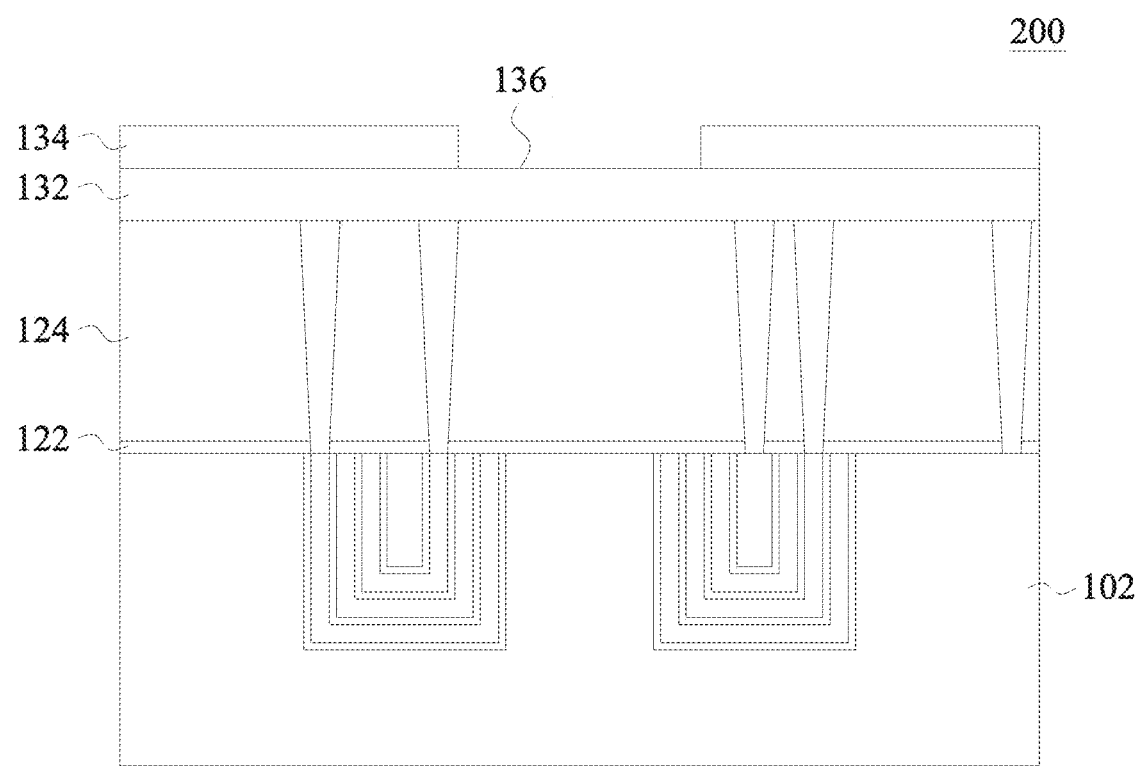

FIG. 2M is a cross-sectional view of semiconductor device 200 following deposition and patterning of an interconnect etch pattern 134 in accordance with some embodiments. The interconnect etch pattern 134, e.g., a metal 1 (M1) etch pattern, is a photoresist formed on the upper surface of the interconnect material layer 132 to expose surface region 136. The photoresist layer is patterned using a photomask or another imaging process, and then developed to form interconnect etch pattern 134.

Following the cross-sectional view of semiconductor device 200 in FIG. 2M, an etching process is utilized to form an opening in interconnect material layer 132, as in semiconductor device 100 (FIG. 1).

In some embodiments, an order of operations for the method described with respect to FIGS. 2A-2M is adjusted. In some embodiments, at least one process described with respect to FIGS. 2A-2M is omitted. In some embodiments, at least one process is added to the description with respect to FIGS. 2A-2M to form a final semiconductor device.

Other approaches for forming a trench capacitor structure include forming stepped trench capacitor structures (not shown). Stepped trench capacitor structures include conductive material extending across a surface of the substrate and/or into multiple trenches. A process for forming the stepped trench capacitor structures incorporates a separate four-step pattern-etch-ash-clean process sequence after deposition of each of the N pairs of dielectric and conductive layers incorporated in the stepped trench capacitor structure. In contrast, the process described above with respect to FIGS. 2A-2M utilizes fewer patterning, etch, and cleaning processes, which helps to increase production output.

In addition, in the stepped trench capacitor structure, each of the N pairs of dielectric and conductive layers increases the portion of the stepped trench capacitor above the top surface of the substrate and complicates subsequent coating and imaging steps for forming an interconnection structure as a result of the reduced planarity. In contrast, the planarization processes described above with FIGS. 2A-2M helps to maintain a substantially planar top of semiconductor device 200. The substantially planar top surface of semiconductor device 200 helps to increase production yield by reducing the risk of errors associated with processing non-planar surfaces.

Figure 3:
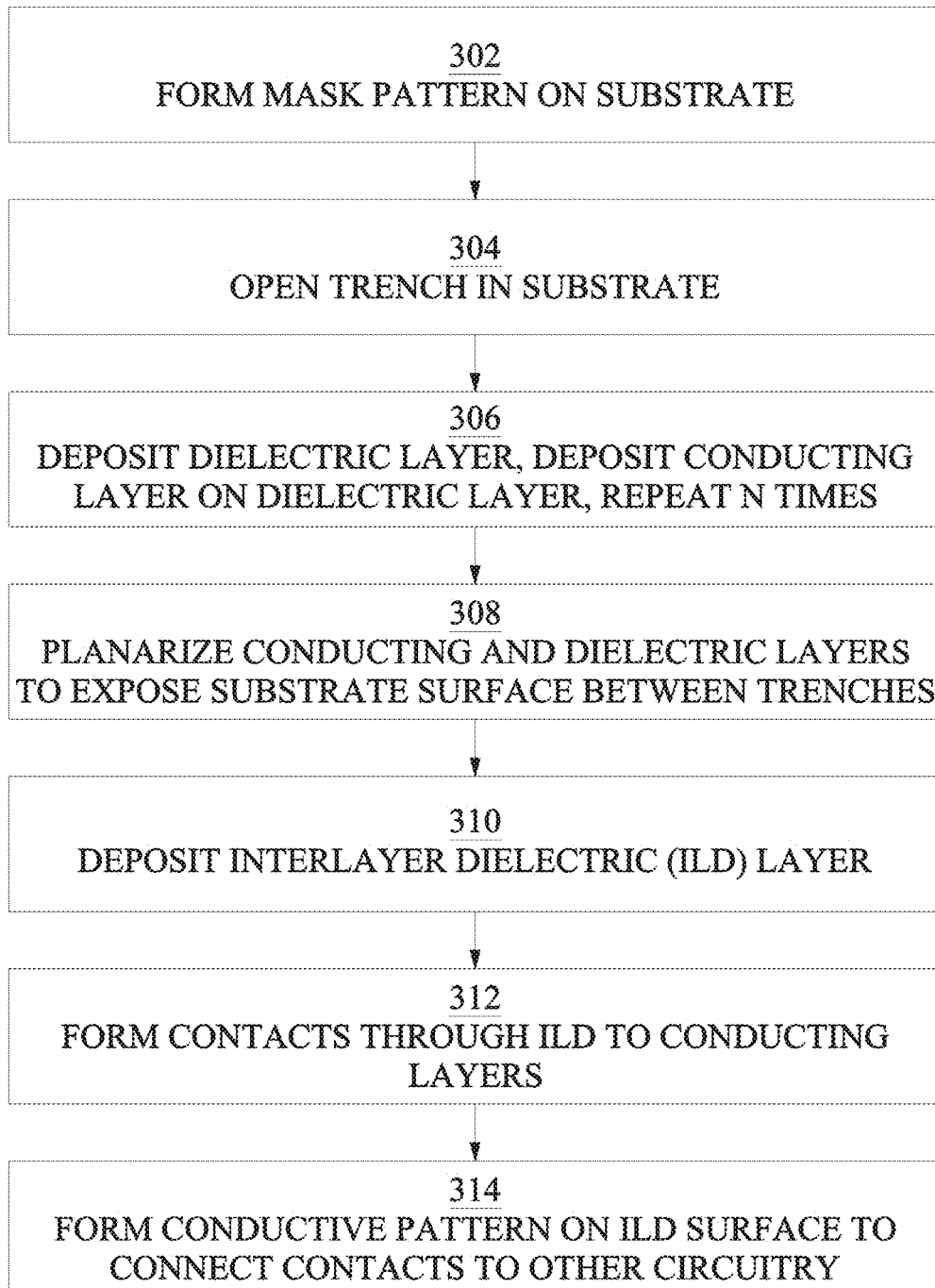
FIG. 3 is a flow chart of a method of forming a semiconductor device in accordance with some embodiments.

FIG. 3 is a flowchart of a method 300 of making a semiconductor device in accordance with some embodiments. In operation 302, a mask pattern is formed on a suitable substrate. In operation 304, exposed regions of the substrate are etched to form a trench or trench opening. A series of alternating dielectric and conductive layers are then deposited, in operation 306, on the etched substrate to form a basic trench capacitor structure including N pairs of dielectric and conductive layers. The resulting structure is planarized, in operation 308, to remove those portions of the alternating dielectric and conductive layers that extend above a plane defined by the substrate surface and form the final capacitor structure. In operation 310, an interlayer dielectric (ILD) layer is deposited on the planarized surface. A series of contact openings are formed through the ILD layer, in operation 312, to expose surface regions of the conductive layers. In operation 314, a conductive pattern is then formed on the ILD layer in order to establish electrical connections between the trench capacitor and other electrical components.

In some embodiments, an order of operations for the method 300 is adjusted. In some embodiments, at least one process of method 300 is omitted. In some embodiments, at least one process is added to method 300 to form a final semiconductor device.

Figure 4:
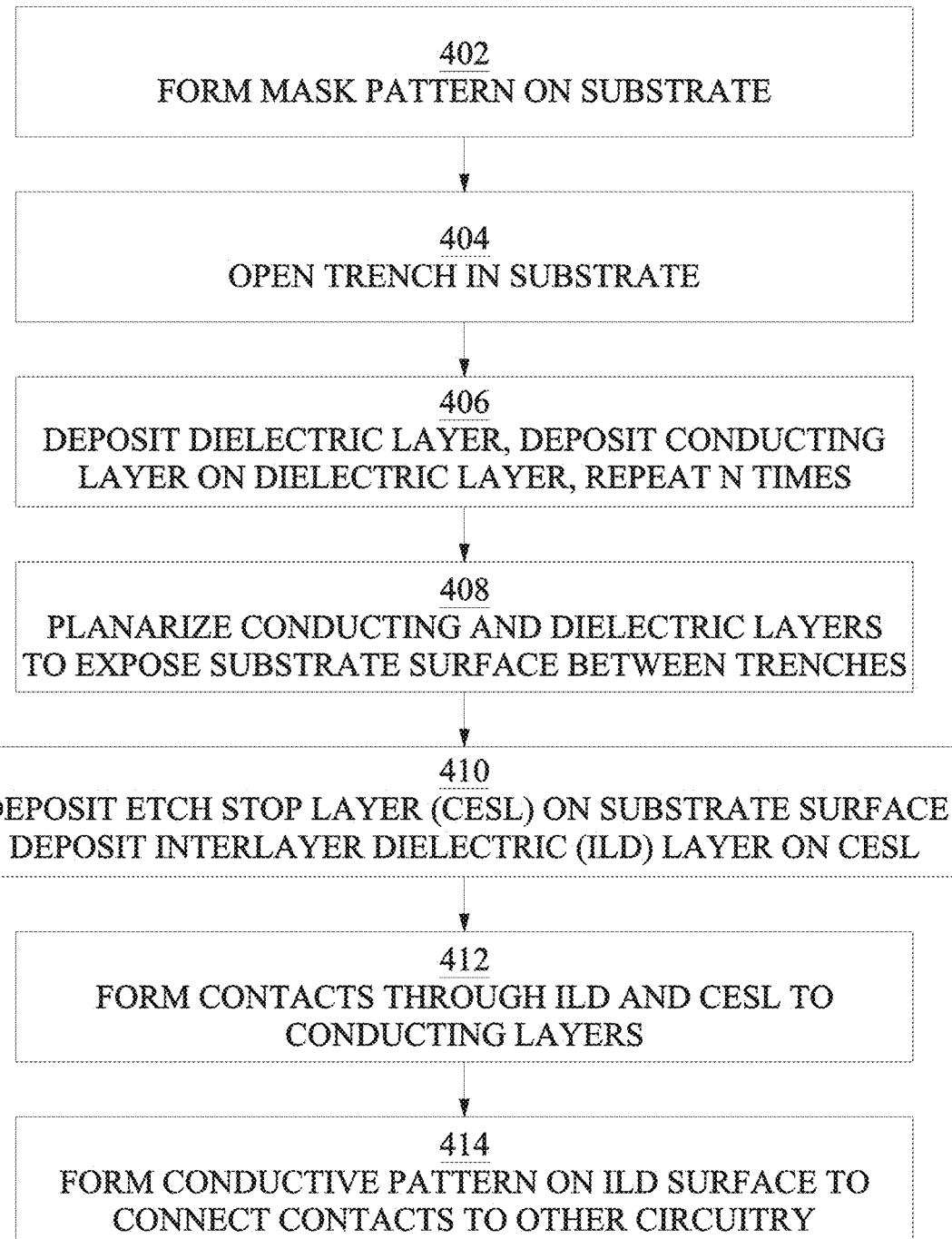
FIG. 4 is a flow chart of a method of forming a semiconductor device in accordance with some embodiments.

FIG. 4 is a flowchart of a method 400 of making a semiconductor device in accordance with some embodiments. A mask pattern is formed on a suitable substrate, operation 402. In operation 404, exposed regions of the substrate are etched to form a trench or trench opening. In some embodiments, if more than one trench is formed in operation 402 the trenches have different widths and/or lengths while in other embodiments the trenches may be patterned and etched to provide substantially identical widths and lengths. A series of alternating dielectric and conductive layers are deposited, in operation 406, on the etched substrate to form a basic trench capacitor structure including N pairs of dielectric and conductive layers. In some embodiments, the differing widths of the trenches will result in some trenches including N pairs of dielectric and conductive layers and other trenches including M pairs of dielectric and conductive layers, with N and M not being equal. In operation 408, the resulting structure is planarized to remove those portions of the alternating dielectric and conductive layers that extend above a plane defined by the substrate surface and form the final capacitor structure. A contact etch stop layer (CESL) is deposited on the planarized surface and an interlayer dielectric (ILD) layer is deposited, in operation 410, on contact etch stop layer. In operation 412, a series of contact openings are formed through the ILD layer and the CESL to expose surface regions of the conductive layers. In operation 414, a conductive pattern is formed on the ILD layer in order to establish electrical connections between the trench capacitor and other electrical components.

In some embodiments, an order of operations for the method 400 is adjusted. In some embodiments, at least one process of method 400 is omitted. In some embodiments, at least one process is added to method 400 to form a final semiconductor device.

Figure 5:
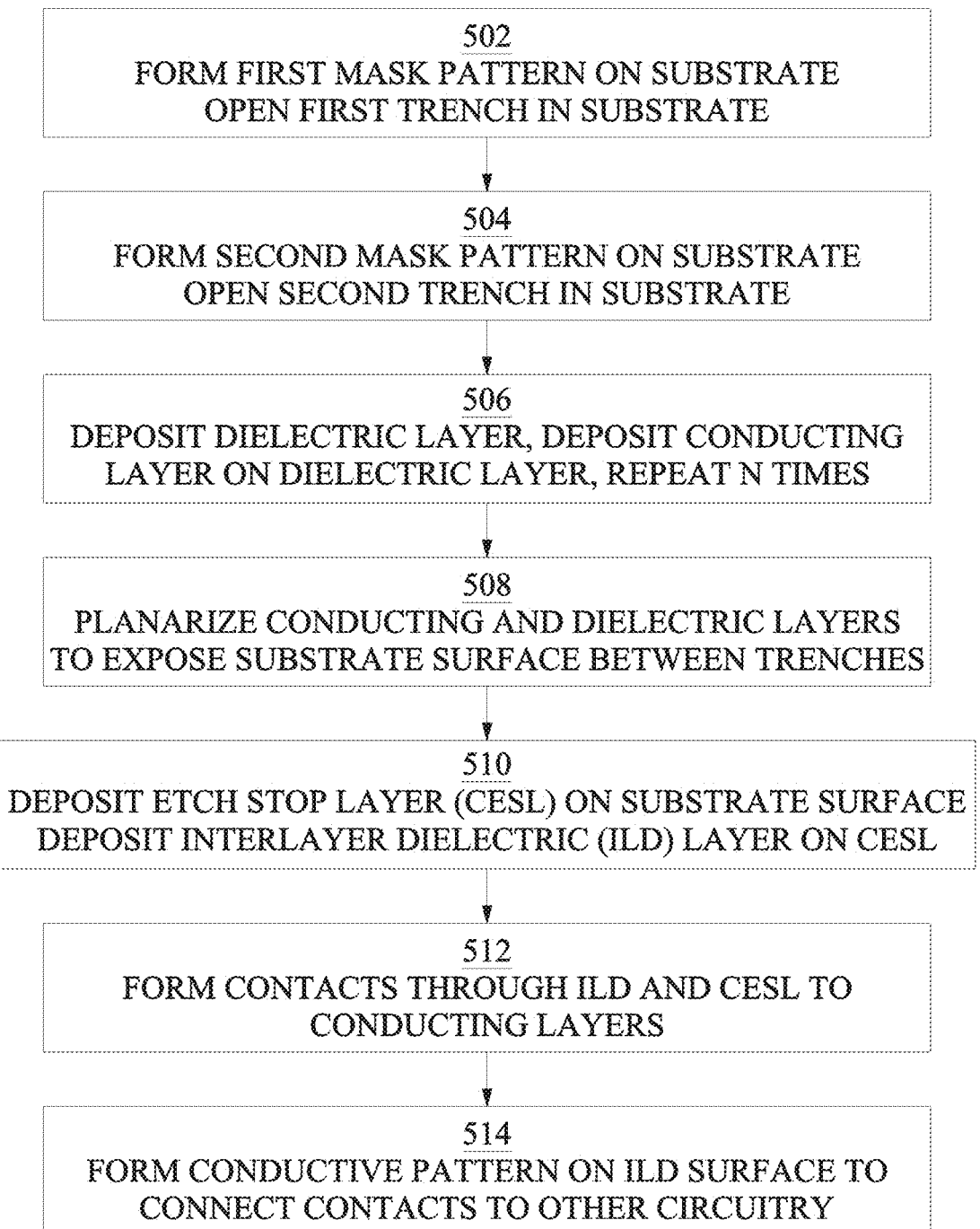
FIG. 5 is a flow chart of a method of forming a semiconductor device in accordance with some embodiments.

FIG. 5 is a flowchart of a method 500 of making a semiconductor device in accordance with some embodiments. A first mask pattern is formed on a suitable substrate and the exposed regions of the substrate are etched to form a first trench or trench opening, in operation 502. A second mask pattern is formed on the etched substrate and the newly exposed regions of the substrate are etched to form a second trench or trench opening, in operation 504. In some embodiments, the first and second trenches formed in operations 502 and 504 have different depths. In operation 506, a series of alternating dielectric and conductive layers are deposited on the etched substrate to fill the first and second trenches with a predetermined number of pairs of dielectric and conductive layers. In some embodiments, the number of pairs of dielectric and conductive layers used to fill the first trench (N) will be different than the number of pairs of dielectric and conductive layers (M) used to fill the second trench. The resulting structure is planarized, in operation 508, to remove those portions of the alternating dielectric and conductive layers that extend above a plane defined by the substrate surface and form separate first and second multilayer trench capacitor structures in the first and second trenches. In operation 510, a contact etch stop layer (CESL) is deposited on the planarized surface and an interlayer dielectric (ILD) layer is deposited on the CESL. In operation 512, a series of contact openings are then formed through the ILD layer and the CESL to expose surface regions of the conductive layers in both the first and second multilayer trench capacitor structures. A conductive pattern is formed on the ILD layer, in operation 514, in order to establish electrical connections between the first and second multilayer trench capacitor structures and other electrical components.

A method of manufacturing a trench capacitor according to an embodiment includes depositing a first dielectric layer over a sidewall and a bottom surface of a first trench opening in a substrate, depositing a first conductive layer over the first dielectric layer, planarizing the first dielectric layer and the first conductive layer to expose a planarized top surface of the substrate and a planarized top surface of the first conductive layer in the first trench opening, depositing an ILD layer over the planarized top surface of the substrate and over the planarized to surface of the first conductive layer, and forming a first electrical contact through the ILD layer to provide an electrical connection to the first conductive layer in the first trench opening.

A method of manufacturing a trench capacitor according to another embodiment includes etching a substrate to define a first trench opening in the substrate, the first trench having a first depth in the substrate, etching the substrate to define a second trench opening in the substrate, the second trench having a second depth in the substrate, depositing a first dielectric layer over the substrate, the first dielectric layer extending into the first trench opening and the second trench opening, depositing a first conductive layer over the first dielectric layer, the first conductive layer extending into the first trench opening and the second trench opening, planarizing the first dielectric layer and the first conductive layer to expose a top surface of the substrate, with the planarizing step including defining a first capacitor structure in the first trench opening and a second trench capacitor structure in the second trench opening, depositing an ILD layer over the top surface of the substrate, the first capacitor structure and the second capacitor structure, forming a first electrical contact through the ILD layer to provide an electrical connection to the first conductive layer in the first capacitor structure, and forming a second electrical contact through the ILD layer to provide an electrical connection to the first conductive layer in the second capacitor structure.

A trench capacitor according to another embodiment including a substrate having a top surface, a first multilayer capacitor structure in the substrate in which a top surface of the first multilayer capacitor structure is substantially planar with the top surface of the substrate, and in which the first multilayer capacitor structure comprises N dielectric layers alternating with N conductive layers.

An aspect of this description relates to a semiconductor device. The semiconductor device includes a substrate. The semiconductor device further includes a first multilayer capacitor in the substrate, wherein the first multilayer capacitor comprises a first plurality of conductive layers. The semiconductor device further includes a first set of contacts, wherein the first set of contacts includes a first contact electrically connected to a first conductive layer of the first plurality of conductive layers, and a second contact electrically connected to a second conductive layer of the first plurality of conductive layers, wherein the first contact is spaced from the second contact by a first distance. The semiconductor device further includes a second multilayer capacitor in the substrate, wherein the second multilayer capacitor comprises a second plurality of conductive layers. The semiconductor device further includes a second set of contacts, wherein the second set of contacts includes a third contact electrically connected to a third conductive layer of the second plurality of conductive layers, and a fourth contact electrically connected to a fourth conductive layer of the second plurality of conductive layers, wherein the third contact is spaced from the fourth contact by a second distance, and the second distance is different from the first distance. In some embodiments, the semiconductor device further includes a dielectric layer over the first multilayer capacitor and the second multiplayer capacitor. In some embodiments, the first contact and the second contact extend through the dielectric layer. In some embodiments, the semiconductor device further includes a conductive line over the dielectric layer, wherein the conductive line electrically connects the first contact and the second contact. In some embodiments, the semiconductor device further includes a fifth contact extending through the dielectric layer, wherein the fifth contact electrically connects to the substrate. In some embodiments, the semiconductor device further includes a contact etch stop layer between the substrate and the dielectric layer. In some embodiments, a third distance from the first contact is to an edge of the first multilayer capacitor is less than a fourth distance from the third contact to an edge of the second multilayer capacitor.

An aspect of this description relates to a semiconductor device. The semiconductor device includes a substrate. The semiconductor device further includes a first multilayer capacitor in the substrate, wherein the first multilayer capacitor comprises a first plurality of conductive layers and a first plurality of dielectric layers. The semiconductor device further includes a first set of contacts, wherein the first set of contacts includes a first contact electrically connected to a first conductive layer of the first plurality of conductive layers, and a second contact electrically connected to a second conductive layer of the first plurality of conductive layers, wherein a first number of dielectric layers of the first plurality of dielectric layers is between the first conductive layer and the second conductive layer. The semiconductor device further includes a second multilayer capacitor in the substrate, wherein the second multilayer capacitor comprises a second plurality of conductive layers and a second plurality of dielectric layers. The semiconductor device further includes a second set of contacts, wherein the second set of contacts includes a third contact electrically connected to a third conductive layer of the second plurality of conductive layers, and a fourth contact electrically connected to a fourth conductive layer of the second plurality of conductive layers, wherein a second number of dielectric layers of the second plurality of dielectric layers is between the third conductive layer and the fourth conductive layer. In some embodiments, a first distance between the first conductive layer and an edge of the first multilayer capacitor is less than a second distance between the second conductive layer and the edge of the first multilayer capacitor. In some embodiments, a third distance between the third conductive layer and an edge of the second multilayer capacitor is less than a fourth distance between the fourth conductive layer and the edge of the second multilayer capacitor. In some embodiments, the first distance is less than the third distance. In some embodiments, the semiconductor device further includes a conductive line electrically connecting the first contact and the second contact. In some embodiments, the semiconductor device further includes a ground contact electrically connected to the first contact and the second contact. In some embodiments, the ground contact is electrically connected to the substrate.

An aspect of this description relates to a semiconductor device. The semiconductor device includes a substrate. The semiconductor device further includes a first multilayer capacitor in the substrate, wherein the first multilayer capacitor comprises a first plurality of conductive layers.

The semiconductor device further includes a first set of contacts, wherein the first set of contacts includes a first contact electrically connected to a first conductive layer of the first plurality of conductive layers, and a second contact electrically connected to a second conductive layer of the first plurality of conductive layers, wherein the first contact is spaced from the second contact by a first distance. The semiconductor device further includes a first conductive line electrically connecting the first contact and the second contact. The semiconductor device further includes a second multilayer capacitor in the substrate, wherein the second multilayer capacitor comprises a second plurality of conductive layers. The semiconductor device further includes a second set of contacts, wherein the second set of contacts includes a third contact electrically connected to a third conductive layer of the second plurality of conductive layers, and a fourth contact electrically connected to a fourth conductive layer of the second plurality of conductive layers, wherein the third contact is spaced from the fourth contact by a second distance. The semiconductor device further includes a second conductive line electrically connecting the third contact and the fourth contact. In some embodiments, the second distance is different from the first distance. In some embodiments, the first conductive line is a same distance from the substrate as the second conductive line. In some embodiments, the semiconductor device further includes a dielectric layer over the substrate. In some embodiments, the first conductive line and the second conductive line are over the dielectric layer. In some embodiments, the semiconductor device further includes a ground contact electrically connected to the first conductive line and to the substrate.

The present disclosure provides embodiments of methods for forming trench capacitors and methods for forming semiconductor devices incorporating at least one such trench capacitor. Although the subject matter has been described in terms of exemplary embodiments, it is not limited thereto. Rather, the appended claims should be construed broadly, to include other variants and embodiments, which may be made by those skilled in the art.

What is claimed is:

1. A semiconductor device comprising:
a substrate;
a first multilayer capacitor in the substrate, wherein the first multilayer capacitor comprises a first plurality of conductive layers;
a first set of contacts, wherein the first set of contacts comprises:
a first contact electrically connected to a first conductive layer of the first plurality of conductive layers, and
a second contact electrically connected to a second conductive layer of the first plurality of conductive layers, wherein the first contact is spaced from the second contact by a first distance;
a second multilayer capacitor in the substrate, wherein the second multilayer capacitor comprises a second plurality of conductive layers; and
a second set of contacts, wherein the second set of contacts comprises:
a third contact electrically connected to a third conductive layer of the second plurality of conductive layers, and
a fourth contact electrically connected to a fourth conductive layer of the second plurality of conductive layers, wherein the third contact is spaced from the fourth contact by a second distance, and the second distance is different from the first distance.

2. The semiconductor device of claim 1, further comprising a dielectric layer over the first multilayer capacitor and the second multiplayer capacitor.

3. The semiconductor device of claim 2, wherein the first contact and the second contact extend through the dielectric layer.

4. The semiconductor device of claim 3, further comprising a conductive line over the dielectric layer, wherein the conductive line electrically connects the first contact and the second contact.

5. The semiconductor device of claim 4, further comprising a fifth contact extending through the dielectric layer, wherein the fifth contact electrically connects to the substrate.

6. The semiconductor device of claim 2, further comprising a contact etch stop layer between the substrate and the dielectric layer.

7. The semiconductor device of claim 1, wherein a third distance from the first contact is to an edge of the first multilayer capacitor is less than a fourth distance from the third contact to an edge of the second multilayer capacitor.

8. A semiconductor device comprising:
a substrate;
a first multilayer capacitor in the substrate, wherein the first multilayer capacitor comprises a first plurality of conductive layers and a first plurality of dielectric layers;
a first set of contacts, wherein the first set of contacts comprises:
a first contact electrically connected to a first conductive layer of the first plurality of conductive layers, and
a second contact electrically connected to a second conductive layer of the first plurality of conductive layers, wherein a first number of dielectric layers of the first plurality of dielectric layers is between the first conductive layer and the second conductive layer;
a second multilayer capacitor in the substrate, wherein the second multilayer capacitor comprises a second plurality of conductive layers and a second plurality of dielectric layers; and
a second set of contacts, wherein the second set of contacts comprises:
a third contact electrically connected to a third conductive layer of the second plurality of conductive layers, and
a fourth contact electrically connected to a fourth conductive layer of the second plurality of conductive layers, wherein a second number of dielectric layers of the second plurality of dielectric layers is between the third conductive layer and the fourth conductive layer.

9. The semiconductor device of claim 8, wherein a first distance between the first conductive layer and an edge of the first multilayer capacitor is less than a second distance between the second conductive layer and the edge of the first multilayer capacitor.

10. The semiconductor device of claim 9, wherein a third distance between the third conductive layer and an edge of the second multilayer capacitor is less than a fourth distance between the fourth conductive layer and the edge of the second multilayer capacitor.

11. The semiconductor device of claim 10, wherein the first distance is less than the third distance.

12. The semiconductor device of claim 8, further comprising a conductive line electrically connecting the first contact and the second contact.

13. The semiconductor device of claim 12, further comprising a ground contact electrically connected to the first contact and the second contact.

14. The semiconductor device of claim 13, wherein the ground contact is electrically connected to the substrate.

15. A semiconductor device comprising:
a substrate;
a first multilayer capacitor in the substrate, wherein the first multilayer capacitor comprises a first plurality of conductive layers;
a first set of contacts, wherein the first set of contacts comprises:
a first contact electrically connected to a first conductive layer of the first plurality of conductive layers, and
a second contact electrically connected to a second conductive layer of the first plurality of conductive layers, wherein the first contact is spaced from the second contact by a first distance;
a first conductive line electrically connecting the first contact and the second contact;
a second multilayer capacitor in the substrate, wherein the second multilayer capacitor comprises a second plurality of conductive layers; and
a second set of contacts, wherein the second set of contacts comprises:
a third contact electrically connected to a third conductive layer of the second plurality of conductive layers,
a fourth contact electrically connected to a fourth conductive layer of the second plurality of conductive layers, wherein the third contact is spaced from the fourth contact by a second distance; and
a second conductive line electrically connecting the third contact and the fourth contact.

16. The semiconductor device of claim 15, wherein the second distance is different from the first distance.

17. The semiconductor device of claim 15, wherein the first conductive line is a same distance from the substrate as the second conductive line.

18. The semiconductor device of claim 15, further comprising a dielectric layer over the substrate.

19. The semiconductor device of claim 18, wherein the first conductive line and the second conductive line are over the dielectric layer.

20. The semiconductor device of claim 15, further comprising a ground contact electrically connected to the first conductive line and to the substrate.

* * * * *